United States Patent
Hashimoto et al.

(10) Patent No.: US 10,495,695 B2
(45) Date of Patent: Dec. 3, 2019

(54) ABNORMALITY DETECTING DEVICE FOR A SYSTEM INCLUDING BATTERY ASSEMBLIES

(71) Applicant: Panasonic Intellectual Property Management Co., Ltd., Osaka (JP)

(72) Inventors: Daichi Hashimoto, Saitama (JP); Takashi Nakazawa, Kanagawa (JP); Haruhiko Sekino, Kanagawa (JP)

(73) Assignee: Panasonic Intellectual Property Management Co. Ltd., Osaka (JP)

( * ) Notice: Subject to any disclaimer, the term of this patent is extended or adjusted under 35 U.S.C. 154(b) by 134 days.

(21) Appl. No.: 15/554,987

(22) PCT Filed: Feb. 25, 2016

(86) PCT No.: PCT/JP2016/001005
§ 371 (c)(1),
(2) Date: Aug. 31, 2017

(87) PCT Pub. No.: WO2016/143280
PCT Pub. Date: Sep. 15, 2016

(65) Prior Publication Data
US 2018/0106865 A1 Apr. 19, 2018

(30) Foreign Application Priority Data
Mar. 11, 2015 (JP) .................. 2015-048389

(51) Int. Cl.
*G01R 31/36* (2019.01)
*H02J 7/00* (2006.01)
(Continued)

(52) U.S. Cl.
CPC ............ *G01R 31/36* (2013.01); *B60L 3/0046* (2013.01); *B60L 58/10* (2019.02); *G01R 31/024* (2013.01);
(Continued)

(58) Field of Classification Search
CPC ...... G01R 31/36; G01R 31/024; G01R 31/02; H02J 7/0016; H02J 7/0021; H02J 7/0026;
(Continued)

(56) References Cited

U.S. PATENT DOCUMENTS 9,300,155 B2 * 3/2016 Mizoguchi ............ H02J 7/0063
9,577,458 B2 * 2/2017 Kaita ................... H02J 7/0026
(Continued)

FOREIGN PATENT DOCUMENTS

| JP | 2014-183671 A | 9/2014 |
| WO | 2014/045567 A1 | 3/2014 |

OTHER PUBLICATIONS

International Search Report of PCT application No. PCT/JP2016/001005 dated Apr. 26, 2016.

*Primary Examiner* — Richard Isla
*Assistant Examiner* — Manuel Hernandez
(74) *Attorney, Agent, or Firm* — Seed IP Law Group LLP

(57) ABSTRACT

An abnormality detecting device detects abnormalities in a system including a plurality of battery assemblies each having a plurality of cells connected in series, and includes: a connecting component configured to connect and disconnect adjacent two of the battery assemblies; and a detachment detector configured to detect whether or not the connecting component has been detached.

9 Claims, 6 Drawing Sheets

(51) Int. Cl.
- *B60L 58/10* (2019.01)
- *B60L 3/00* (2019.01)
- *G01R 31/02* (2006.01)
- *H01M 10/44* (2006.01)
- *B60L 58/22* (2019.01)
- *H01M 10/48* (2006.01)

(52) U.S. Cl.
CPC ......... *H01M 10/441* (2013.01); *H02J 7/0029* (2013.01); *B60L 58/22* (2019.02); *H01M 10/482* (2013.01); *H01M 2220/20* (2013.01); *H02J 7/0021* (2013.01); *H02J 7/0026* (2013.01)

(58) Field of Classification Search
CPC .. H02J 7/0029; H01M 10/441; H01M 10/482; H01M 2220/20; B60L 3/0046; B60L 58/10; B60L 58/22

USPC ........................................................ 320/134
See application file for complete search history.

(56) References Cited

U.S. PATENT DOCUMENTS

| | | | |
|---|---|---|---|
| 2006/0103351 A1* | 5/2006 | Tanigawa | H02J 7/0016 320/118 |
| 2011/0149454 A1* | 6/2011 | Shibuya | H01M 2/34 361/87 |
| 2011/0298424 A1* | 12/2011 | Yamauchi | B60L 3/0046 320/118 |
| 2014/0247013 A1* | 9/2014 | Mizoguchi | H02J 7/0063 320/118 |
| 2016/0241054 A1* | 8/2016 | Matsumoto | B60L 3/0046 |
| 2017/0117596 A1* | 4/2017 | Kubo | H01M 10/425 |

* cited by examiner

ABNORMALITY DETECTING DEVICE FOR A SYSTEM INCLUDING BATTERY ASSEMBLIES

CROSS-REFERENCE TO RELATED APPLICATION

This application is a U.S. national stage application of the PCT International Application No. PCT/JP2016/001005 filed on Feb. 25, 2016, which claims the benefit of foreign priority of Japanese patent application No. 2015-048389 filed on Mar. 11, 2015, the contents all of which are incorporated herein by reference.

BACKGROUND

Technical Field

The present invention relates to an abnormality detecting device configured to detect an abnormality in a system employing a plurality of battery assemblies.

Description of the Related Art

There have been conventionally developed cell voltage monitoring devices that monitor terminal voltages of a plurality of cells constituting a battery assembly, and discharge any cell having a high terminal voltage via a discharge resistance corresponding to the cell to equalize terminal voltages of all the cells. Examples of such conventional cell voltage monitoring devices include a power supply device described in Patent Literature 1. This power supply device includes a plurality of cell voltage detection circuits and a plurality of discharge circuits, each being assigned to the corresponding one of a plurality of cells constituting a battery assembly.

In electric vehicles, a plurality of battery assemblies directly connected to each other is used to obtain a high voltage. At the time of the replacement of a battery assembly for maintenance or the like, an electrical connection between battery assemblies is once interrupted, and therefore, a connecting component such as a connector (also referred to as "service plug") is sometimes provided between the battery assemblies. The detachment of the connecting component allows interruption of the connection of battery assemblies, and thus, a battery assembly can be easily replaced.

CITATION LIST

Patent Literature

PTL 1: International Publication No. 2014/045567.

BRIEF SUMMARY

An abnormality detecting device according to the present invention is configured to detect an abnormality in a system including a plurality of battery assemblies each having a plurality of cells connected in series, and includes: a connecting component configured to connect and disconnect adjacent two of the battery assemblies; and a detachment detector configured to detect whether or not the connecting component has been detached.

The present invention allows the detection of whether or not the connecting component has been detached, and thus contributes to the elimination of the necessity to provide a cell voltage monitoring device for every battery assembly.

DETAILED DESCRIPTION

Prior to a description of embodiments of the present invention, problems in conventional devices will be briefly described.

The detection of whether a connecting component for connecting two battery assemblies adjacent to each other has been attached or detached has not been conventionally studied. Consequently, it has been necessary that, in order to prevent occurrence of an abnormal voltage between any terminals in the cell monitoring device in the event of the connecting component being detached, each of a plurality of battery assemblies is individually provided with a cell voltage monitoring device, and the plurality of the cell voltage monitoring devices is insulated from each other.

An object of the present invention is to provide an abnormality detecting device capable of contributing to the elimination of the necessity to provide a cell voltage monitoring device individually for every battery assembly in a system in which two battery assemblies adjacent to each other are connected to each other via a connecting component.

Hereinafter, preferred embodiments of the present invention will be described in detail with reference to the drawings.

First, circumstances leading to the embodiments of the present invention will be described.

Figure 6:
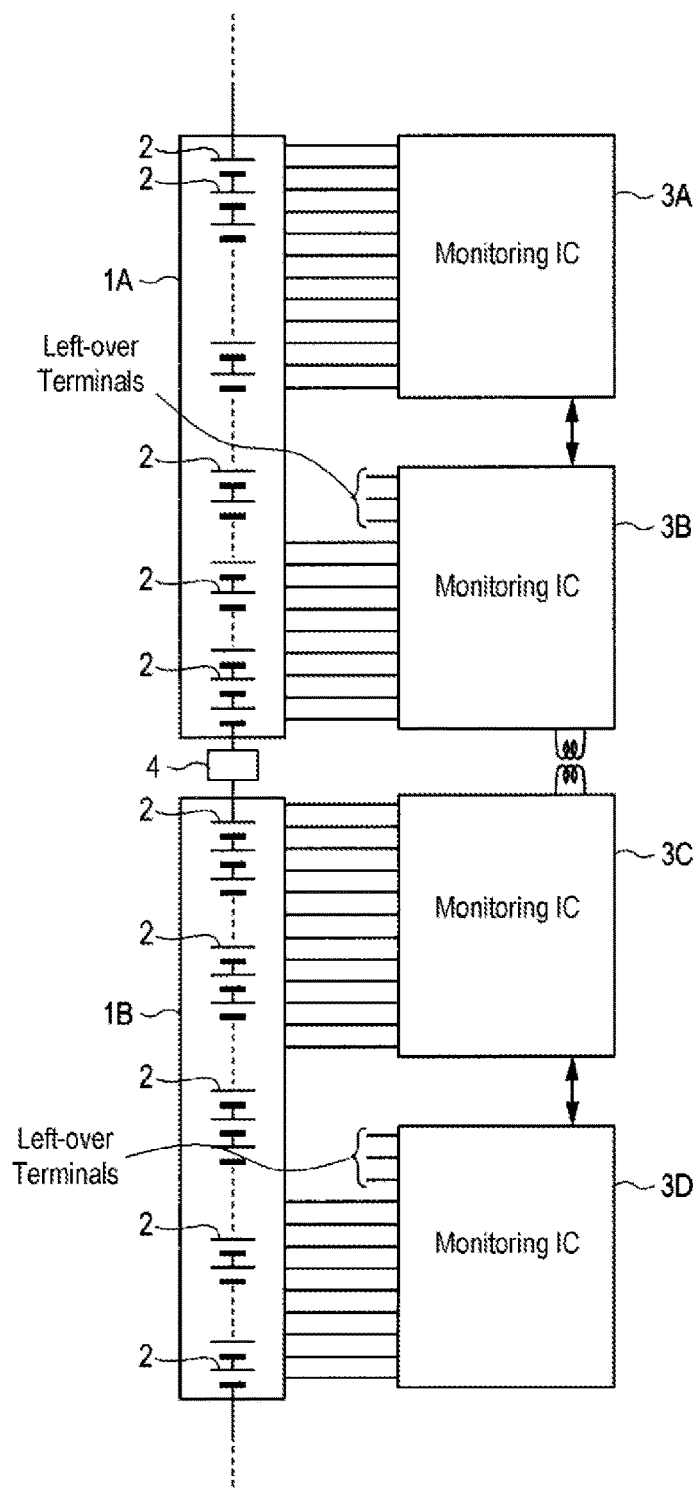
FIG. 6 is a diagram for describing circumstances leading to the achievement of the abnormality detecting device according to the first exemplary embodiment of the present invention.

FIG. 6 is a diagram for describing the circumstances leading to the embodiments of the present invention. FIG. 6 illustrates an example in which four monitoring ICs (integrated circuits) 3A to 3D are provided for two battery assemblies 1A and 1B.

FIG. 6 is a diagram illustrating an example in which the terminal voltage of each cell 2 of two battery assemblies 1A and 1B connected in series are monitored by four monitoring ICs 3A to 3D. Monitoring ICs 3A and 3B monitor the terminal voltage of each cell 2 of battery assembly 1A, and monitoring ICs 3C and 3D monitor the terminal voltage of each cell 2 of battery assembly 1B. Monitoring ICs 3A to 3D communicate with each other, and control the terminal voltages of their respective cells 2 to be monitored so that the terminal voltages are equalized as the whole of battery assemblies 1A and 1B (such control is referred to as "cell balancing"). Specifically, when one of cells 2 has a higher voltage, this cell 2 is discharged so that the voltage is decreased to the extent of being equal to those of other cells 2.

Connector 4 is provided between battery assemblies 1A and 1B. Connector 4 is detachable, and is detached when at least one of battery assemblies 1A and 1B is replaced. Note that, although not illustrated, interface circuits (not illustrated) each including a discharge resistance and a filter resistance are provided between battery assembly 1A and monitoring IC 3A, between battery assembly 1A and monitoring IC 3B, between battery assembly 1B and monitoring IC 3C, and between battery assembly 1B and monitoring IC 3D, respectively.

When connector 4 is detached and a load connected to battery assembly 1A and battery assembly 1B operates, a high voltage is generated between battery assembly 1A and battery assembly 1B. Consequently, it is necessary that each of monitoring ICs 3A to 3D is provided so as not to extend over both battery assembly 1A and battery assembly 1B, and that monitoring ICs 3A and 3B connected to battery assembly 1A are insulated from monitoring ICs 3C and 3D connected to battery assembly 1B.

In the case where general-purpose integrated circuits are used as monitoring ICs 3A to 3C from a cost viewpoint, the total number of terminals of monitoring ICs 3A to 3C cannot be made equal to the total number of terminals of battery assemblies. Consequently, a problem arises that, in the configuration illustrated in FIG. 6, many terminals are left over in monitoring IC 3A to 3D.

Hereinafter, an abnormality detecting device capable of solving such problem will be described.

First Exemplary Embodiment

Figure 1:
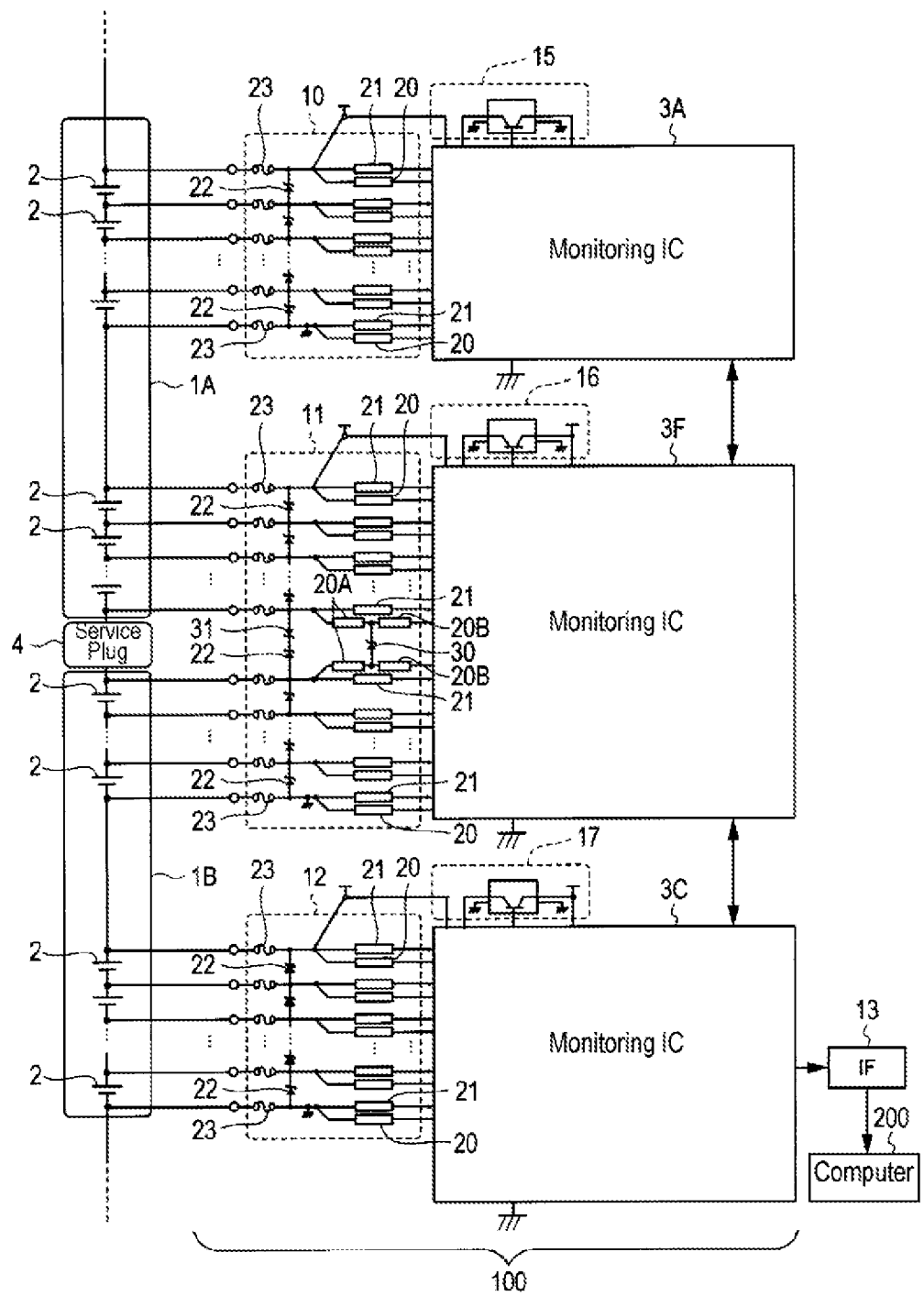
FIG. 1 is a diagram illustrating the configuration of an abnormality detecting device according to a first exemplary embodiment of the present invention.

FIG. 1 is a diagram illustrating the configuration of an abnormality detecting device according to a first exemplary embodiment of the present invention. Note that, in FIG. 1, constituent elements that are the same as those in FIG. 6 are assigned the same reference numerals. Abnormality detecting device 100 according to the present embodiment includes: three monitoring ICs 3A, 3F, and 3C; interface units 10 to 12 configured to connect monitoring ICs 3A, 3F, and 3C to battery assemblies 1A and 1B, respectively; microcomputer 200; interface circuit 13 configured to transmit information of monitoring ICs 3A, 3F, and 3C to microcomputer 200; and power supply units 15 to 17 configured to supply an operating current to monitoring ICs 3A, 3F, and 3C, respectively. Connector 4 is provided between battery assemblies 1A and 1B. These constituents of the abnormality detecting device are typically mounted on one circuit board, but, the way of mounting the constituents is not limited to this, and may be modified in various ways. For example, the constituents may be mounted on a plurality of circuit boards.

Among these constituents, monitoring ICs 3A, 3F, and 3C correspond to an example of a semiconductor integrated circuit of a cell voltage monitor according to the present invention. Connector 4 corresponds to an example of a connecting component according to the present invention. Power supply unit 16 corresponds to an example of a current generator according to the present invention. Microcomputer 200 corresponds to an example of a determiner according to the present invention. Monitoring IC 3F, interface unit 11, power supply unit 16, and microcomputer 200 correspond to an example of a detachment detector according to the present invention.

Monitoring IC 3A monitors the terminal voltages of some of all cells 2 of battery assembly 1A, and monitoring IC 3C monitors the terminal voltages of some of all cells 2 of battery assembly 1B. Monitoring IC 3F monitors the terminal voltages of remaining cells 2 of all cells 2 of battery assembly 1A, and the terminal voltages of remaining cells 2 of all cells 2 of battery assembly 1B.

Monitoring IC 3A mutually communicates to other monitoring ICs 3F and 3C and controls the terminal voltages of cells 2 that monitoring IC 3A is assigned to monitor so that the terminal voltages are equalized as the whole of battery assemblies 1A and 1B. Specifically, when one of cells 2 has a higher voltage, a switch corresponding to this cell 2 is turned on to pass a current between the terminals of this cell 2 via discharge resistance 20 in interface unit 11, thereby lowering the voltage. Likewise, also monitoring IC 3F mutually communicates to other monitoring ICs 3A and 3C and controls the terminal voltages of cells 2 that monitoring IC 3F is assigned to monitor so that the terminal voltages are equalized as the whole of battery assemblies 1A and 1B. Likewise, also monitoring IC 3C mutually communicates to other monitoring ICs 3A and 3F and controls the terminal voltages of cells 2 that monitoring IC 3C is assigned to monitor so that the terminal voltages are equalized as the whole of battery assemblies 1A and 1B. To equalize the voltages of cells of a battery assembly is referred to as "to perform cell balancing".

Interface unit 10 includes: a plurality of filter resistances 21 each connected to the corresponding one of a plurality of voltage detection terminals of monitoring IC 3A; and a plurality of discharge resistances 20 each connected to the corresponding one of a plurality of discharge terminals of monitoring IC 3A. Interface unit 10 further includes: a plurality of protection diodes (for example, zener diodes) 22 each connected to both terminals of the corresponding one of the cells therebetween; and fuses 23 each connected to a terminal of each cell. Filter resistance 21 functions as a filter for noise removal in combination with a capacitive element provided inside monitoring IC 3A.

As is the case with interface unit 10, interface unit 12 includes: a plurality of filter resistances 21 each connected to the corresponding one of a plurality of voltage detection terminals of monitoring IC 3C; and a plurality of discharge resistances 20 each connected to the corresponding one of a plurality of discharge terminals of monitoring IC 3C. Interface unit 12 further includes: a plurality of protection diodes 22 each connected to both terminals of the corresponding one of the cells therebetween; and fuses 23 each connected to a terminal of each cell. Filter resistance 21 functions as a filter for noise removal in combination with a capacitive element provided inside monitoring IC 3C.

Interface unit 11 includes: a plurality of filter resistances 21 each connected to the corresponding one of a plurality of voltage detection terminals of monitoring IC 3F; and a plurality of discharge resistances 20 each connected to the corresponding one of a plurality of discharge terminals of monitoring IC 3F. Among the plurality of discharge resistances 20, there are 2 pairs of discharge resistances 20A and 20B formed by dividing one discharge resistance into two.

Filter resistance 21 functions as a filter for noise removal in combination with a capacitive element provided inside monitoring IC 3F.

Interface unit 11 further includes protection diodes 22 each provided between adjacent terminals which are connected to both terminals of the corresponding one of cells 2, respectively. Interface unit 11 further includes abnormality detection diode 30 and protection diode (for example, zener diodes) 31. Abnormality detection diode 30 corresponds to an example of a voltage drop element according to the present invention; for example, a zener diode is employed in the embodiment. The details of connection between discharge resistances 20, 20A, and 20B, filter resistance 21, protection diode 22, abnormality detection diode 30, and protection diode 31 in interface unit 11 will be described later.

Discharge resistances 20 of interface units 10 to 12 are used for discharging each cell 2 of battery assembly 1A or for discharging each cell 2 of battery assembly 1B. Discharge resistances 20 are provided to an positive terminal and a negative terminal of one cell 2, respectively.

In interface unit 11, discharge resistance 20 connected to one terminal of connector 4 is composed of two discharge resistances 20A and 20B. Furthermore, discharge resistance 20 connected to the other terminal of connector 4 is composed of two discharge resistances 20A and 20B. Abnormality detection diode 30 is connected to the midpoint between two discharge resistances 20A and 20B (first resistance) connected to one end of connector 4 and the midpoint of two discharge resistances 20A and 20B (second resistance) connected to the other end of connector 4 therebetween. In this case, abnormality detection diode 30 is connected, not via connector 4, in the direction of a current flow from battery assembly 1B to battery assembly 1A.

In interface unit 11, protection diode 31 is provided so as to be connected in the opposite direction of a current flow to protection diode 22 interposed between both terminals of connector 4. In other words, in interface unit 11, two protection diodes 22 and 31 connected in series opposite to each other are interposed between both terminals of connector 4. The reason why two protection diodes 22 and 31 connected in series opposite to each other are interposed between both terminals of connector 4 is, for example, as follows. First, a first reason will be described. Some contact resistance is present in connector 4, and furthermore, wiring resistance due to the provision of connector 4 is present. The values of these resistances are very small; however, at the time of charge and discharge of battery assemblies 1A and 1B, a large current flows, and accordingly, a relatively high voltage is generated. Protection diodes 22 and 31 prevent a current from flowing toward abnormality detection diode 30 due to that voltage. A voltage generated due to the provision of connector 4 at the time of charge is the reverse of a voltage at the time of discharge, and accordingly, two protection diodes 22 and 31 are connected in series opposite to each other. Next, a second reason will be described. Charge and discharge current caused by battery assemblies 1A and 1B is a large current of several dozen amperes and in contrast, the rated current of a common general circuit board on which protection diode 22 and the like are mounted is at most several dozen milliamperes. If only protection diode 22 is provided and protection diode 31 is not provided, when the charge/discharge current of battery assemblies 1A and 1B flows into protection diode 22 and a circuit board, there is a possibility that protection diode 22 and the circuit board are damaged due to fired. To prevent this damage, two protection diodes 22 and 31 are connected in series opposite to each other.

Power supply unit 15 receives power from battery assembly 1A, and decreases a voltage with a regulator to supply the power to monitoring IC 3A. Power supply unit 16 receives power from battery assembly 1A and battery assembly 1B, and decreases a voltage with a regulator to supply the power to monitoring IC 3F. Power supply unit 17 receives power from battery assembly 1B, and decreases a voltage with a regulator to supply the power to monitoring IC 3C.

Figure 2:
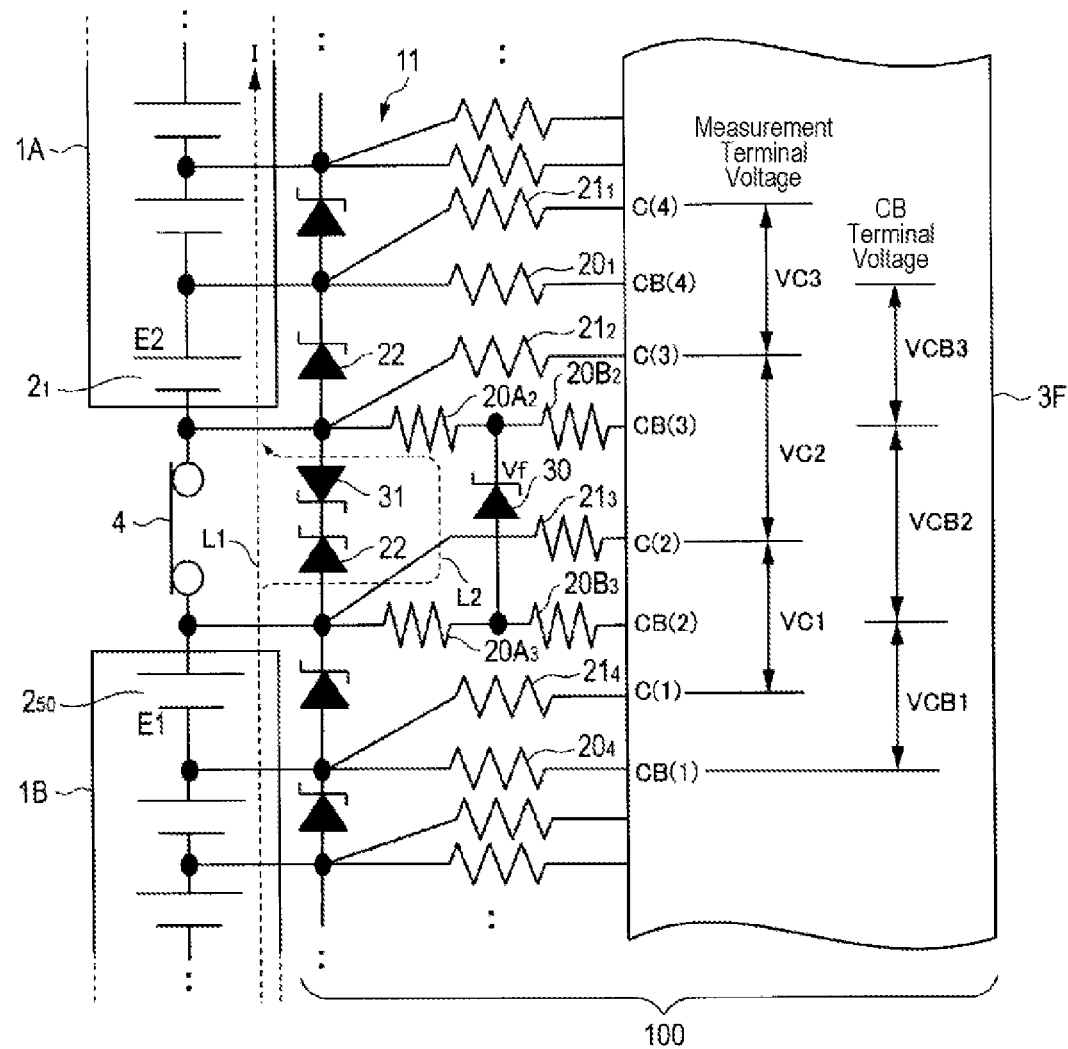
FIG. 2 is a diagram illustrating the configuration of a part of a connection portion between a monitoring IC and battery assemblies in the abnormality detecting device according to the first exemplary embodiment of the present invention.

FIG. 2 is a diagram illustrating the configuration of a part of a connection portion between monitoring IC 3F and battery assemblies 1A and 1B. In FIG. 2, monitoring IC 3F includes a plurality of C (measurement) terminals for detecting cell voltages, and a plurality of CB terminals for discharging cells. In FIG. 2, C (4) terminal is connected to one end of filter resistance $21_1$, C (3) terminal is connected to one end of filter resistance $21_2$, C (2) terminal is connected to one end of filter resistance $21_3$, and C (1) terminal is connected to one end of filter resistance $21_4$. Furthermore, CB (4) terminal is connected to one end of discharge resistance $20_1$, CB (3) terminal is connected to one end of discharge resistance $20B_2$, CB (2) terminal is connected to one end of discharge resistance $20B_3$, and CB (1) terminal is connected to one end of discharge resistance $20_4$. CB (2) terminal and CB (3) terminal are for detecting voltages related to connector 4.

The positive side of cell $2_1$ of battery assembly 1A is connected to C (4) terminal via filter resistance $21_1$ and connected to CB (4) terminal via discharge resistance $20_1$. Furthermore, one end of connector 4 is connected to the negative side of cell $2_1$ of battery assembly 1A, and a connection portion thereof is connected to C (3) terminal via filter resistance $21_2$ and connected to CB (3) terminal via discharge resistance $20A_2$ and discharge resistance $20B_2$ connected in series. Furthermore, the other end of connector 4 is connected to the positive side of cell $2_{50}$ of battery assembly 1B (cell $2_{50}$ is a cell defined assuming that battery assembly 1B is composed of 50 cells 2), and a connection portion thereof is connected to C (2) terminal via filter resistance $21_3$ and connected to CB (2) terminal via discharge resistance $20A_3$ and discharge resistance $20B_3$ connected in series. Furthermore, the negative side of cell $2_{50}$ of battery assembly 1B is connected to C (1) terminal via filter resistance $21_4$ and connected to CB (1) terminal via discharge resistance $20_4$.

At a predetermined timing such as the time of turning on the ignition of an electric vehicle or at an arbitrary timing, monitoring IC 3F and microcomputer 200 confirm whether or not connector 4 has been detached.

To detect whether or not connector 4 has been detached, monitoring IC 3F measures CB terminal voltage VCB3 between CB (3) terminal and CB (4) terminal on one end side of connector 4 (on the upper side of FIG. 2), and measures CB terminal voltage VCB1 between CB (1) terminal and CB (2) terminal on the other end side of connector 4 (on the lower side of FIG. 2). Furthermore, monitoring IC 3F measures measurement terminal voltage VC3 between C (3) terminal and C (4) terminal on one end side of connector 4, and measures measurement terminal voltage VC1 between C (1) terminal and C (2) terminal on the other end side of connector 4. Monitoring IC 3F notifies microcomputer 200, via monitoring IC 3C, of measured CB terminal voltages VCB1 and VCB3 and measured measurement terminal voltages VC1 and VC3. Microcomputer 200 compares measurement terminal voltage VC1 with CB terminal voltage VCB1 and also compares measurement terminal voltage VC3 with CB terminal voltage VCB3, and, based on whether or not a voltage drop (R×I) caused by a resistance has occurred, microcomputer 200 determines whether connector 4 has been attached or detached.

(1) The values of CB terminal voltages and measurement terminal voltages at the time when connector 4 has been attached are as follows, where the voltage of cell $2_1$ of battery assembly 1A is denoted by "E2", the voltage of cell $2_{50}$ of battery assembly 1B is "E1", the values of discharge resistances $20A_2$ and $20A_3$ are each "R", and an IC operating current is "I." Note that "Vf" represents the forward voltage of abnormality detection diode 30.

CB terminal voltage :VCB3=E2
:VCB2=0
:VCB1=E1
Measurement terminal voltage :VC3=E2
:VC2=0
:VC1=E1

(2) The values of CB terminal voltages and measurement terminal voltages at the time when connector 4 is detached are as follows.

CB terminal voltage :VCB3=E2−RI
:VCB2=−Vf
:VCB1=E1−RI
Measurement terminal voltage: VC3=E2
:VC2=−Vf−2RI
:VC1=E1

When connector 4 is attached, the value of CB terminal voltage VCB1 is "E1", whereas when connector 4 is detached, the value of CB terminal voltage VCB1 is "E1−RI". When connector 4 is attached, the value of CB terminal voltage VCB3 is "E2", whereas when connector 4 is detached, the value of CB terminal voltage VCB3 is "E2−RI". As illustrated in FIG. 2, when connector 4 is attached, IC operating current I flows through path L1 through connector 4, whereas when connector 4 is detached, IC operating current I flows through path L2 through discharge resistances $20A_2$ and $20A_3$ and abnormality detection diode 30. Accordingly, CB terminal voltage VCB1 is lowered by a voltage drop due to discharge resistance $20A_3$, and CB terminal voltage VCB3 is lowered by a voltage drop due to discharge resistance $20A_2$. As described above, CB terminal voltage VCB1 and CB terminal voltage VCB3 vary due to discharge resistances $20A_2$ and $20A_3$, and the detachment of connector 4 causes both CB terminal voltage VCB1 and CB terminal voltage VCB3 to be lowered by a voltage calculated by resistance value R×IC operating current I.

When determining that connector 4 is detached, microcomputer 200 executes control to prevent a load connected to battery assembly 1A and battery assembly 1B from operating. This prevents monitoring IC 3F from being broken due to the generation of a high voltage between battery assembly 1A and battery assembly 1B. Furthermore, when determining that connector 4 is detached, microcomputer 200 may transmit information indicating the detachment of connector 4 to a display device so that the display device displays a warning. Alternatively, microcomputer 200 may transmit information indicating the detachment of connector 4 to an audio output unit so that the audio output unit outputs a warning sound. Alternatively, when determining that connector 4 is detached, microcomputer 200 may notify monitoring IC 3F of the determination result so that monitoring IC 3F takes measures to prevent itself (monitoring IC 3F) from breaking down. For example, monitoring IC 3F may insulate each terminal of monitoring IC 3F from the internal circuit.

As described above, in abnormality detecting device 100 according to the first exemplary embodiment, monitoring IC 3F makes use of CB (2) terminal and CB (3) terminal to detect the detachment of connector 4 (also referred to as disengagement). CB (3) terminal is connected to one end of connector 4 via discharge resistances $20A_2$ and $20B_2$, and CB (2) terminal is connected to the other end of connector 4 via discharge resistances $20A_3$ and $20B_3$, and furthermore, abnormality detection diode 30 is interposed between a connection portion of discharge resistances $20A_3$ and $20B_3$ and a connection portion of discharge resistances $20A_2$ and $20B_2$. When connector 4 is detached, CB terminal voltage VCB3, that is, the terminal voltage of cell $2_1$ of battery assembly 1A on one end side of connector 4, and CB terminal voltage VCB1, that is, the terminal voltage of cell $2_{50}$ of battery assembly 1B on the other end side of connector 4 are lowered by the resistance values of discharge resistances $20A_2$ and $20A_3$, respectively, and thus, by detecting such a drop in CB terminal voltage VCB1, monitoring IC 3F can detect the detachment of connector 4.

Furthermore, three monitoring ICs 3A, 3F, and 3C monitor two battery assemblies 1A and 1B, and accordingly, compared with the example illustrated in FIG. 6, the number of monitoring ICs can be reduced. Naturally, no terminal or a smaller number of terminals are left over on monitoring IC sides.

Furthermore, in abnormality detecting device 100 according to the first exemplary embodiment, there is a large difference between a voltage measured when connector 4 is detached and a voltage measured when connector 4 is attached. Thus, even when an error in voltage measurement accuracy develops, whether connector 4 is attached or detached can be determined with high accuracy.

Second Exemplary Embodiment

Figure 3:
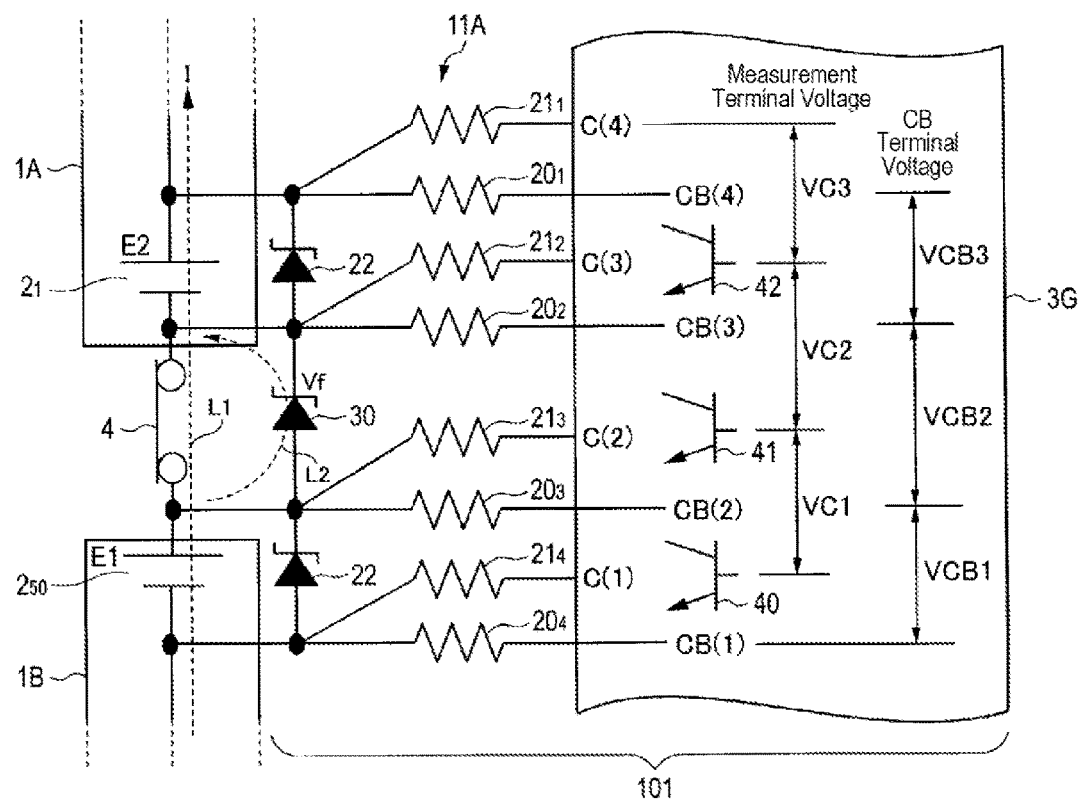
FIG. 3 is a diagram illustrating the configuration of a part of a connection portion between a monitoring IC and battery assemblies in an abnormality detecting device according to a second exemplary embodiment of the present invention.

FIG. 3 is a diagram illustrating the configuration of a part of a connection portion between monitoring IC 3G and battery assemblies 1A and 1B in abnormality detecting device 101 according to a second exemplary embodiment of the present invention. In FIG. 3, abnormality detecting device 101 according to the present embodiment is configured to detect the detachment of connector 4 by detecting forward voltage Vf of abnormality detection diode 30 during cell balancing. Interface unit 11A in abnormality detecting device 101 is slightly different from interface unit 11 in abnormality detecting device 100 according to the above-mentioned first exemplary embodiment, in that discharge resistances connected to both ends of connector 4 are not discharge resistances formed by dividing a discharge resistance into two, but each of the discharge resistances is a single discharge resistance, like discharge resistances $20_1$ and $20_4$. Discharge resistance $20_2$ is connected to one end of connector 4, and discharge resistance $20_3$ is connected to the other end of connector 4.

Furthermore, in abnormality detecting device 100 according to First exemplary embodiment, abnormality detection diode 30 is connected to the midpoint between discharge resistances $20A_2$ and $20B_2$ divided into two and the midpoint between discharge resistances $20A_3$ and $20B_3$ divided into two, whereas, in abnormality detecting device 101 according to the present embodiment, abnormality detection diode 30 is interposed between two nodes in interface unit 11A. The ends of connector 4 are connected to the two nodes, respectively.

At a predetermined timing such as the time of turning on the ignition of an electric vehicle or at an arbitrary timing, monitoring IC 3G and microcomputer 200 confirm, whether or not connector 4 is detached.

When detecting whether or not connector 4 has been detached, monitoring IC 3G performs the cell balancing between cell $2_1$ of battery assembly 1A on one end side of connector 4 and cell $2_{50}$ of battery assembly 1B on the other end side of connector 4. In other words, both semiconductor switches 40 and 42 are turned on to discharge cell $2_{50}$ of battery assembly 1B and cell $2_1$ of battery assembly 1A, respectively. At this time, cell $2_{50}$ of battery assembly 1B is discharged via discharge resistances $20_3$ and $20_4$, and cell $2_1$ of battery assembly 1A is discharged via discharge resistances $20_1$ and $20_2$.

After performing the cell balancing between cell $2_1$ of battery assembly 1A and cell $2_{50}$ of battery assembly 1B, monitoring IC 3G measures CB terminal voltage VCB2 between CB (2) terminal and CB (3) terminal for detecting the detachment of connector 4, and also measures measurement terminal voltage VC3 on the cell $2_1$ side of battery assembly 1A and measurement terminal voltage VC1 on the cell $2_{50}$ side of battery assembly 1B. Then, monitoring IC 3G notifies microcomputer 200 of the measurement results, and microcomputer 200 determines whether or not connector 4 has been detached. Microcomputer 200 compares a theoretical value (0.5×(VC1+VC3)) obtained from measurement terminal voltage VC1 and measurement terminal voltage VC3 with CB terminal voltage VCB2, and determines whether connector 4 is attached or detached, based on whether or not there is a difference in forward voltage Vf of abnormality detection diode 30. The above-mentioned theoretical value is obtained as a CB terminal voltage in a state in which connector 4 is attached, and for example, in the case where resistance $20_1$ to resistance $20_4$ are equal to each other.

(1) The values of CB terminal voltages and measurement terminal voltages at the time when connector 4 is attached are as follows, where the voltage of cell $2_1$ of battery assembly 1A is denoted by "E2", the voltage of cell $2_{50}$ of battery assembly 1B is "E1", and an IC operating current is "I". Note that "Vf" represents the forward voltage of abnormality detection diode 30.

CB terminal voltage and measurement terminal voltage in the case of not using the cell balancing
  CB terminal :VCB2=0
  Measurement terminal :VC3=E2
  :VC1=E1

CB terminal voltage and measurement terminal voltage in the case of using the cell balancing (semiconductor switches 40 and 42 are both ON)
  CB terminal :VCB3=0 (≈Vcesat)
  :VCB2=0.5×(E1+E2)
  :VCB1=0 (≈Vcesat)
  Measurement terminal :VC3=E2
  :VC2=0
  :VC1=E1

(2) The values of CB terminal voltages and measurement terminal voltages at the time when connector 4 is detached are as follows.

CB terminal voltage and measurement terminal voltage in the case of not using the cell balancing
  CB terminal :VCB2=–Vf
  Measurement terminal :VC3=E2
  :VC1=E1

CB terminal voltage and measurement terminal voltage in the case of using the cell balancing (semiconductor switches 40 and 42 are both ON)
  CB terminal :VCB3=0 (≈Vcesat)
  :VCB2=0.5×(E1+E2)–Vf
  :VCB1=0 (≈Vcesat)
  Measurement terminal :VC3=E2
  :VC2=–Vf
  :VC1=E1

Here, Vcesat represents a voltage between input/output terminals of each of turned-on semiconductor switches 40 and 42.

When the cell balancing is performed in a state in which connector 4 is attached, the value of CB terminal voltage VCB2 is "0.5×(E1+E2)", whereas when the cell balancing is performed in a state in which connector 4 is detached, the value of CB terminal voltage VCB2 is "0.5×(E1+E2)–Vf". As illustrated in FIG. 3, when connector 4 is attached, IC operating current I flows through path L1 through connector 4, whereas when connector 4 is detached, IC operating current I flows through path L2 through abnormality detection diode 30. CB terminal voltage VCB2 is lowered by forward voltage Vf of abnormality detection diode 30. As described above, CB terminal voltage VCB2 varies due to forward voltage Vf of abnormality detection diode 30 during the cell balancing, and the detachment of connector 4 causes CB terminal voltage VCB2 to be lowered by forward voltage Vf of abnormality detection diode 30.

When determining that connector 4 is detached, microcomputer 200 executes control over the detachment of connector 4, for example, control to prevent a load connected to battery assembly 1A and battery assembly 1B from operating.

As described above, in abnormality detecting device 101 according to the present embodiment, monitoring IC 3G makes use of CB (2) terminal and CB (3) terminal to detect the open state of connector 4. CB (3) terminal is connected to one end of connector 4 via discharge resistance $20_2$, and CB (2) terminal is connected to the other end of connector 4 via discharge resistance $20_3$, and furthermore, abnormality detection diode 30 is interposed between both the ends of connector 4. When the cell balancing is performed in a state in which connector 4 is detached, CB terminal voltage VCB2 is lowered by forward voltage Vf of abnormality detection diode 30, and thus, by detecting such a drop in CB terminal voltage VCB2, monitoring IC 3G can detect the detachment of connector 4.

Furthermore, three monitoring ICs 3A, 3G, and 3C monitor two battery assemblies 1A and 1B, and accordingly, compared with the example illustrated in FIG. 6, the number of monitoring ICs can be reduced. Naturally, no terminal or a smaller number of terminals are left over on monitoring IC sides.

Third Exemplary Embodiment

Figure 4:
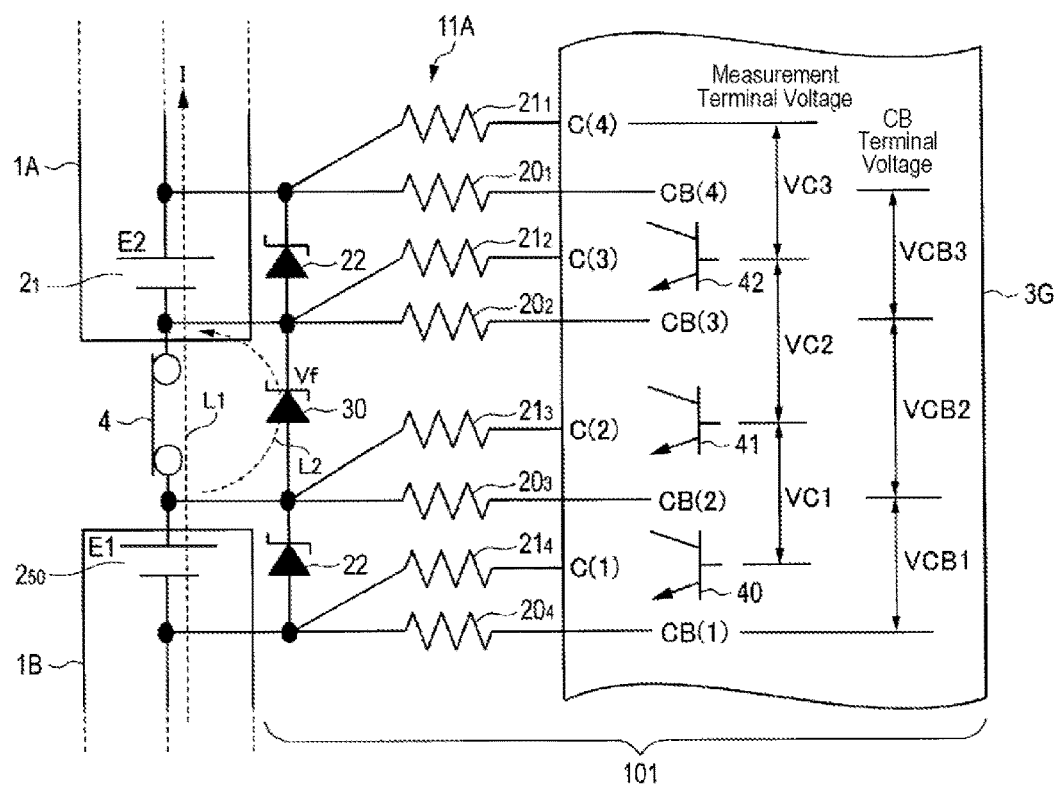
FIG. 4 is a diagram illustrating the configuration of part of a connection portion between a monitoring IC and battery assemblies in an abnormality detecting device according to a third exemplary embodiment of the present invention.

FIG. 4 is a diagram illustrating the configuration of a part of a connection portion between monitoring IC 3H and battery assemblies 1A and 1B in abnormality detecting device 102 according to a third exemplary embodiment of the present invention. In FIG. 4, as is the case with abnormality detecting device 100 according to the above-mentioned first exemplary embodiment, abnormality detecting device 102 according to the present embodiment is configured to detect the detachment of connector 4 by detecting a voltage drop element due to a resistance. Abnormality detecting device 102 includes the same interface circuit as interface unit 11 of abnormality detecting device 100 according to the first exemplary embodiment.

At a predetermined timing such as the time of turning on the ignition of an electric vehicle or at an arbitrary timing, monitoring IC 3H and microcomputer 200 confirm, whether or not connector 4 is detached.

When detecting whether or not connector 4 has been detached, monitoring IC 3H perform cell balancing between cell $2_1$ of battery assembly 1A on one end side of connector 4 and cell $2_{50}$ of battery assembly 1B on the other end side of connector 4. In other words, both semiconductor switches 40 and 42 are turned on to discharge cell $2_{50}$ of battery assembly 1B and cell $2_1$ of battery assembly 1A, respectively. In this case, cell $2_{50}$ of battery assembly 1B is discharged via discharge resistances $20_3$ (resistance $20A_3$+resistance $20B_3$) and $20_4$, and cell $2_1$ of battery assembly 1A is discharged via discharge resistances $20_1$ and $20_2$ (resistance $20A_2$+resistance $20B_2$).

After performing the cell balancing between cell $2_1$ of battery assembly 1A and cell $2_{50}$ of battery assembly 1B, monitoring IC 3H measures CB terminal voltage VCB2 between CB (2) terminal and CB (3) terminal to detect the detachment of connector 4, and also measures measurement terminal voltage VC3 on the cell $2_1$ side of battery assembly 1A and measurement terminal voltage VC1 on the cell $2_{50}$ side of battery assembly 1B. Then, monitoring IC 3H notifies microcomputer 200 of the measurement results, and microcomputer 200 determines whether or not connector 4 has been detached.

When the cell balancing is performed and connector 4 has been detached, IC operating current $I_1$ flows through abnormality detection diode 30; equalizing current $I_2$ flows through resistance $20A_3$, resistance $20B_3$, semiconductor switch 40, and resistance $20_4$; and equalizing current $I_3$ flows through resistance $20_1$, semiconductor switch 42, resistance $20B_2$, and resistance $20A_3$.

Microcomputer 200 compares a theoretical value (0.5×(VC1+VC3)) obtained from measurement terminal voltage VC1 and measurement terminal voltage VC3 with CB terminal voltage VCB2, and determines whether connector 4 is attached or detached, based on whether or not there is a difference in value of voltage calculated by a formula, Vf+resistance $20A_3$×resistance $20B_3$×$I_1$/resistance $20_4$+($I_2$+resistance $20A_3$+$I_3$×resistance $20A_2$), which is the sum of a voltage generated by the passage of IC operating current $I_1$, forward voltage Vf of abnormality detection diode 30, a voltage generated by the passage of equalizing current $I_2$, and a voltage generated by the passage of equalizing current $I_3$. The above-mentioned theoretical value is obtained as a CB terminal voltage in a state in which connector 4 is attached, and for example, when resistance $20_1$, (resistance $20A_2$+resistance $20B_2$), (resistance $20A_3$+resistance $20B_3$), and resistance $20_4$ are equal to each other, and resistance $20A_2$ and resistance $20A_3$ are equal to each other.

(1) The values of CB terminal voltages and measurement terminal voltages at the time when connector 4 is attached are as follows, where the voltage of cell $2_1$ of battery assembly 1A is denoted by "E2", the voltage of cell $2_{50}$ of battery assembly 1B is "E1", an IC operating current is "$I_1$", an equalizing current on the lower side of connector 4 is "$I_2$", and an equalizing current on the upper side of connector 4 is "$I_3$". Note that "Vf" represents the forward voltage of abnormality detection diode 30.

CB terminal voltage and measurement terminal voltage in the case of not using the cell balancing
    CB terminal :VCB2=0
    Measurement terminal :VC3=E2
    :VC1=E1

CB terminal voltage and measurement terminal voltage in the case of using the cell balancing (semiconductor switches 40 and 42 are both ON)
    CB terminal :VCB3=0 (≈Vcesat)
    :VCB2=0.5×(E1+E2)
    :VCB1=0 (≈Vcesat)
    Measurement terminal: VC3=E2
    :VC2=0
    :VC1=E1

(2) The values of CB terminal voltages and measurement terminal voltages at the time when connector 4 is detached are as follows.

CB terminal voltage and measurement terminal voltage in the case of not using the cell balancing
    CB terminal :VCB2=−Vf
    Measurement terminal :VC3=E2
    :VC1=E1

CB terminal voltage and measurement terminal voltage in the case of using the cell balancing (semiconductor switches 40 and 42 are both ON)
    CB terminal :VCB3=0 (≈Vcesat)
    :VCB2=0.5×(E1+E2)−Vf−resistance $20A_3$×resistance $20B_3$×$I_1$/resistance $20_4$−($I_2$+$I_3$)×resistance $20A_3$
    :VCB1=0 (≈Vcesat)
    Measurement terminal :VC3=E2
    :VC2=−resistance $20A_3$×(2×$I_1$+$I_2$+$I_3$)−Vf
    :VC1=E1

Here, Vcesat represents a voltage between input/output terminals of each of turned-on semiconductor switches 40 and 42. Furthermore, as described above, resistance $20A_3$ is replaceable with resistance $20A_2$ since the resistances are of the same magnitude, and the same applies to resistance $20B_3$ and resistance $20_4$.

When the cell balancing is performed in a state in which connector 4 is attached, the value of CB terminal voltage VCB2 is "0.5×(E1+E2)", whereas when the cell balancing is performed in a state in which connector 4 is detached, the value of CB terminal voltage VCB2 is "0.5×(E1+E2)−Vf−resistance $20A_3$×resistance $20B_3$×resistance $20_4$−($I_2$+$I_3$)×resistance $20A_3$". As illustrated in FIG. 4, when connector 4 is attached, IC operating current I flows through path L1 through connector 4, whereas when connector 4 is detached, IC operating current I flows through path L2 through discharge resistances $20A_2$ and $20A_3$ and abnormality detection diode 30. When the cell balancing is performed, equalizing currents $I_2$ and $I_3$ flow. Thus, CB terminal voltage VCB2 is lowered by a value obtained by adding up a voltage generated by the passage of IC operating current $I_1$, forward voltage Vf of abnormality detection diode 30, a voltage generated by the passage of equalizing current $I_2$, and a voltage generated by the passage of equalizing current $I_3$.

When determining that connector 4 is detached, microcomputer 200 executes control over the detachment of connector 4, for example, control to prevent a load connected to battery assembly 1A and battery assembly 1B from operating.

As described above, in abnormality detecting device 102 according to the present embodiment, monitoring IC 3H includes CB (2) terminal and CB (3) terminal for detecting the open state of connector 4, and CB (3) terminal is connected to one end of connector 4 via discharge resistances $20A_2$ and $20B_2$. Furthermore, CB (2) terminal is connected to the other end of connector 4 via discharge resistances $20A_3$ and $20B_3$, and furthermore, abnormality detection diode 30 is interposed between a connection portion discharge resistances $20A_3$ and $20B_3$ and a connection portion of discharge resistances $20A_2$ and $20B_2$. When the cell balancing is performed in a state in which connector 4 is detached, CB terminal voltage VCB2 is lowered by a value obtained by adding up a voltage generated by the passage of IC operating current $I_1$, forward voltage Vf of abnormality detection diode 30, a voltage generated by the passage of equalizing current $I_2$, and a voltage generated by the passage of equalizing current $I_3$. Thus, by detecting such a drop in CB terminal voltage VCB2, monitoring IC 3H can detect the detachment of connector 4.

Furthermore, three monitoring ICs 3A, 3H, and 3C monitor two battery assemblies 1A and 1B, and accordingly, compared with the example illustrated in FIG. 6, the number of monitoring ICs can be reduced. Naturally, no terminal or a smaller number of terminals are left over on monitoring IC sides.

Furthermore, in abnormality detecting device 102 according to the third exemplary embodiment, there is a large difference between a voltage measured when connector 4 is detached and a voltage measured when connector 4 is attached. Thus, even when a relatively large error in voltage measurement accuracy develops, whether connector 4 is attached or detached can be determined with high accuracy.

Figure 5:
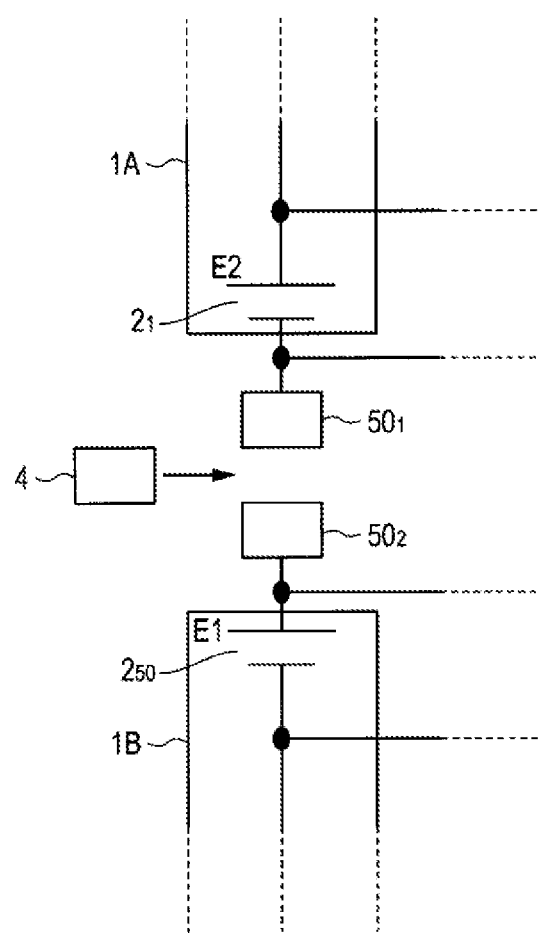
FIG. 5 is a diagram illustrating an application example of a connector portion used commonly in the abnormality detecting devices according to the first to third exemplary embodiments of the present invention.

Note that connector 4 may be not interposed simply between battery assemblies, but interposed between a bus bar connected to the negative side of a battery assembly and a bus bar connected to the positive side of another battery assembly. FIG. 5 is a diagram illustrating an example of the above-mentioned case. In FIG. 5, bus bar $50_1$ and bus bar $50_2$ are connected to the negative side of the battery assembly 1A and the positive side of the battery assembly 1B, respectively, and, connector 4 is interposed between these bus bars.

Although the present invention has been described in detail or with reference to the specific embodiments, it will be apparent to those of skill in the art that various changes and modifications can be made without departing from the sprit and scope of the present disclosure.

For example, in the above-mentioned embodiments, the time of turning on the ignition of an electric vehicle is mentioned as an example of the predetermined timing for confirming whether or not connector 4 is detached, but, any timing may be set, for example, the confirmation may be performed a plurality of times at predetermined intervals.

In the above-mentioned embodiments, an diode is mentioned as an example of the voltage drop element according to the present invention, but various elements capable of causing a voltage drop, such as a resistance and a transistor operated like a resistance, may be employed.

In the above-mentioned embodiments, some specific descriptions are provided in which the detection of the detachment of connector 4 is performed while switching between the use of the cell balancing and the use of no cell balancing and changing terminals used for the measurement of terminal voltage. However, as long as the fact that a voltage between predetermined terminals at the time when connector 4 is detached differs from a voltage therebetween at the time when connector 4 is attached is made use of, the timing of measurement can be suitably changed between the time of using the cell balancing and the time of using no cell balancing. Furthermore, the predetermined terminals for measuring a voltage therebetween are not limited to those mentioned in the embodiments.

In the above-mentioned embodiment, it is described that, in interface units 10, 11, and 12, filter resistance 21 functions as a filter for noise removal in combination with a capacitive element provided inside monitoring ICs 3A, 3C, and 3F. However, filter resistance 21 may function as a filter for noise removal in combination with a capacitive element provided somewhere other than inside monitoring ICs 3A, 3C, and 3F. For example, filter resistance 21 may be used in combination with a capacitive element, such as a capacitor, separately provided outside monitoring ICs 3A, 3C and 3F.

In the above-mentioned embodiment, the power supply unit configured to generate an operating current for a monitoring IC is described as an example of a current generator for passing current through a plurality of battery assemblies. However, various configurations may be applied to the current generator according to the present invention as long as the configurations allow current to pass through two battery assemblies; for example, the current generator may be provided specially to detect the detachment of connector 4.

In the third exemplary embodiment, it is described that, when the cell balancing is performed and connector 4 is detached, IC operating current $I_1$ flows through path L2 (discharge resistance $20A_3$, abnormality detection diode 30, and discharge resistance $20A_2$), but, as IC operating current $I_1$, there sometimes arise a current flowing from the negative side of cell $2_{50}$ of battery assembly 1B via resistance $20_4$, semiconductor switch 40, and resistance $20B_3$ and a current flowing to the positive side of cell $2_1$ of battery assembly 1A via resistance $20B_2$, semiconductor switch 42, and resistance $20_1$. Therefore, these currents are also preferably included in IC operating current $I_1$. Specifically, the value of a current flowing through abnormality detection diode 30 is preferably considered as IC operating current $I_1$.

INDUSTRIAL APPLICABILITY

The present invention is applicable to an abnormality detecting device for detecting an abnormality in a plurality of battery assemblies used for electric vehicles and the likes.

REFERENCE MARKS IN THE DRAWINGS 1A, 1B battery assembly
2, $2_1$, $2_{50}$ cell
3A, 3C, 3F, 3G, 3H monitoring IC
4 connector
5 transformer
10, 11, 11A, 12 interface unit
13 interface circuit
15 to 17 power supply unit
20, 20A, 20B discharge resistance
21 filter
22, 31 protection diode
23 fuse
30 abnormality detection diode
40 to 42 semiconductor switch
$50_1$, $50_2$ bus bar
100, 101, 102 abnormality detecting device
20 microcomputer The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An abnormality detecting device configured to detect an abnormality in a system including a plurality of battery assemblies each including a plurality of cells connected in series, the abnormality detecting device comprising:
    a connecting component configured to connect and disconnect adjacent two of the battery assemblies; and
    a detachment detector configured to detect whether or not the connecting component has been detached,
    wherein the detachment detector comprises:
        a cell voltage monitor configured to detect a terminal voltage of each of the cells of the two battery assemblies and to discharge each of the cells of the two battery assemblies;
        an interface unit configured to connect each of the cells of the two battery assemblies to the cell voltage monitor,
    wherein the cell voltage monitor includes a semiconductor integrated circuit including a first voltage detection terminal, a second voltage detection terminal, a first discharge terminal, and a second discharge terminal,
    wherein the semiconductor integrated circuit is connected across the two battery assemblies connected to each other via the connecting component,
    wherein the interface unit is configured to:
        connect a first end of the connecting component to the first voltage detection terminal of the semiconductor integrated circuit;
        connect a second end of the connecting component to the second voltage detection terminal of the semiconductor integrated circuit;
        connect a first branch point that is located between the first end of the connecting component and the first voltage detection terminal to the first discharge terminal of the semiconductor integrated circuit;
        connect a second branch point that located between the second end of the connecting component and the second voltage detection terminal to the second discharge terminal of the semiconductor integrated circuit,
    wherein the interface unit comprises:
        a first diode directly connected to the first branch point; and
        a second diode directly connected to the first diode and the second branch point, and
    wherein the detachment detector comprises:
        a third diode directly connected to a first point and a second point, the first point being located between the first branch point and the first discharge terminal and the second point being located between the second branch point and the second discharge terminal.

2. The abnormality detecting device according to claim 1, wherein the detachment detector comprises:
    a current generator configured to pass current through the two battery assemblies; and
    a determiner configured to determine whether the connecting component is attached or detached, based on voltages between a plurality of nodes of the interface unit to each which two cells are connected, the two cells being adjacent to a first end and a second end of the connecting component, respectively.

3. The abnormality detecting device according to claim 2, wherein a current passed by the current generator operates the cell voltage monitor.

4. The abnormality detecting device according to claim 2, wherein the interface unit includes a plurality of resistances configured to connect the cells of the battery assemblies to terminals of the cell voltage monitor, respectively, and
wherein one end of the third diode is connected to an intermediate node of a first resistance among the resistances, and another end of the third diode is connected to an intermediate node of a second resistance among the resistances.

5. The abnormality detecting device according to claim 2, wherein the first diode and the second diode are connected in series opposite to each other between the first branch point and the second branch point.

6. The abnormality detecting device according to claim 2, wherein a current passed by the current generator operates the cell voltage monitor.

7. The abnormality detecting device according to claim 2, wherein the connecting component is a detachable connector.

8. The abnormality detecting device according to claim 1, wherein the connecting component is a detachable connector.

9. The abnormality detecting device according to claim 1, wherein the interface unit includes a first resistor directly connected to the first branch point and the first point, and a second resistor directly connected to the second branch point and the second point.

* * * * *